United States Patent [19]

Flecha et al.

[11] Patent Number: 5,432,460
[45] Date of Patent: Jul. 11, 1995

[54] APPARATUS AND METHOD FOR OPENS AND SHORTS TESTING OF A CIRCUIT BOARD

[75] Inventors: Edwin Flecha; Kelvin D. Henry, both of Boca Raton; James C. Mahlbacher, Lake Worth; Michael Servedio, Boca Raton, all of Fla.; Kenneth S. Weinaug, Lilburn, Ga.

[73] Assignee: International Business Machines Corporation, Armonk, N.Y.

[21] Appl. No.: 176,175

[22] Filed: Jan. 3, 1994

[51] Int. Cl.⁶ ............................................. G01R 31/02
[52] U.S. Cl. .................................. 324/754; 324/537; 324/679; 324/705; 324/718
[58] Field of Search ............... 324/537, 660, 679, 705, 324/713, 715, 718

[56] References Cited

U.S. PATENT DOCUMENTS

| | | | |
|---|---|---|---|
| 4,565,966 | 1/1986 | Burr et al. | 324/525 X |
| 5,006,808 | 4/1991 | Watts | 324/537 |
| 5,122,753 | 6/1992 | Myers et al. | 324/537 |
| 5,138,266 | 8/1992 | Stearns | 324/537 |
| 5,192,913 | 3/1993 | Goruganthu | 324/537 |
| 5,256,975 | 10/1993 | Mellitz et al. | 324/679 X |
| 5,266,901 | 11/1993 | Woo | 324/537 |

*Primary Examiner*—Kenneth A. Wieder
*Assistant Examiner*—Glenn W. Brown
*Attorney, Agent, or Firm*—Romualdas Strimaitis; Anthony N. Magistrale

[57] ABSTRACT

A method and apparatus for testing circuit boards uses a pair of probes to contact the various nodes on the circuit board. A single one of the pair of probes may be used to deposit a charge at a being tested net and checking for the presence of a charge at subsequent nets to determine whether a short condition exists. Moreover, the pair of probes is used to contact two nodes of a network being tested to measure the resistance within the network being tested; the measured resistance being compared to a nominal resistance, to determine whether an open condition exists. In addition, the pair of probes may be used to measure the resistance between networks in order to verify or determine whether a short condition exists between networks.

8 Claims, 2 Drawing Sheets

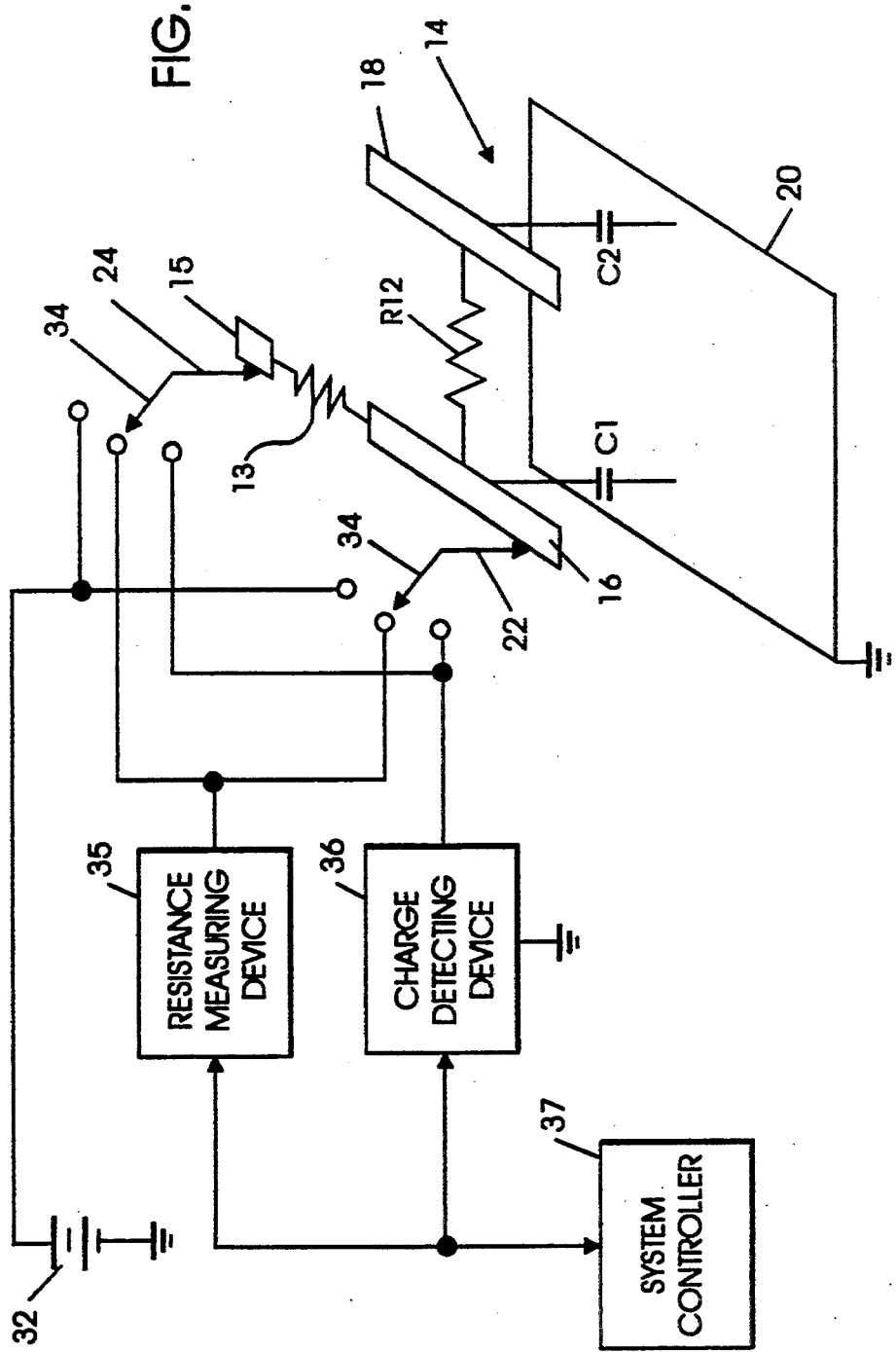

APPARATUS AND METHOD FOR OPENS AND SHORTS TESTING OF A CIRCUIT BOARD

FIELD OF THE INVENTION

The present invention relates to high density circuit boards and ceramic substrates. In particular, an apparatus and method is described for detecting the continuity of a network on a circuit board or ceramic substrate; and whether any such network is shorted to another such network.

BACKGROUND OF THE INVENTION

Open and short tests are required for manufacturing high density printed circuit boards and ceramic substrates. In view of the high density in which electronic components are packaged onto each circuit board, the integrity of each circuit board, i.e. the integrity of the different metal interconnections that effect each of the net in the circuit boards, is of paramount import. Thus, defects such as an "open" circuit condition whereby higher than expected resistance appears between certain sections of a given network, or a "short" circuit condition whereby two separate networks, which theoretically should have infinite resistance therebetween, in fact appear to be shorted together, or have an unacceptable internet (leakage) resistance, are to be detected and avoided.

Testing of electrical interconnection networks for opens and shorts in networks results in improved product reliability. Typically, testing is done with a "bed-of-nails" test fixture. The nails are probes typically spaced 0.100 inches apart which make contact electrically between the tester and the points of contact on the board being tested. In the bed of nails method, it is highly desirable to contact all test points at once to avoid step and repeat operations. The difficulty with the bed-of-nails approach are problems with the probe heads which present design, manufacture, and maintenance; challenges and particularly with the decreasing size of surface features and grid spacings on boards being produced. Construction of a bed-of-nails test head for each of the different types of boards and substrates to be checked involves a high cost and long fabrication time.

An alternative to the bed-of-nails approach for testing for opens and shorts is using movable probes to measure the net capacitance relative to an internal or external reference plane. In so doing, an AC frequency based impedance measurement may be taken at selected nodes or networks relative to a reference. An exemplary prior art method in which two moving probes are used to perform tests on nets is disclosed in U.S. Pat. No. 4,565,966 to Burr et al. As disclosed, Burr performs a series of one point measurements of the capacitance of a network relative to a reference plane. To test the continuity of each net, a resistance measurement is effected between two probes, each placed at an end point of the net. This method, however, requires a capacitance data file which is established in a "learn" procedure wherein capacitance measurements are made for a series or set of circuit boards until enough data to establish "norm" values having statistical properties such as standard deviation. Moreover, the method of U.S. Pat. No. 4,565,966 uses an AC frequency based impedance measurement which requires a number of periods to compute.

Another alternative to the bed-of-nails approach for testing for opens and shorts is to apply a charge between a node on a network and a reference plane, to detect the presence or absence of a charge at subsequent nodes during a test sequence, and to compare the detected charge with a reference pattern of charge transfer.

In U.S. Pat. No. 5,138,266 a method is disclosed for testing circuit boards using a stored charge technique for identifying opens and shorts with a single probe. A probe is used to make contact with various nodes on the circuit board and to charge or discharge these nodes. A reference plane is closely spaced from the board under test, and a charge transfer measurement arrangement is connected to the reference plane. The charging of the nodes by capacitively coupling to the reference plane is measured and compared with a reference data file, thereby eliminating the need to develop a capacitance value data file. That is, the reference data file indicates whether the presence or absence of a charge for a particular node during the test sequence should be interpreted as a potential defect. A practical limitation of this method is that relatively small nets are unable to store appreciable charge. As a result, an accurate determination of whether a short exists between the charged net and another net cannot be made. Moreover, another limitation of this method is that resistive faults in the network paths may not be detected and, therefore, not providing complete test results suitable for assuring electrical integrity of the circuit board being tested.

Another exemplary prior art method for testing circuit boards using a stored charge technique in U.S. Pat. No. 5,122,753. A method for testing circuit boards is disclosed which uses an electron beam to charge networks within the circuit board to be tested. The method is one in which a first pass and second pass are available in order to determine whether a defect exists and to identify all faulty networks. The method is limited in its testing of opens in that it is unable to discriminate between the magnitude of potential opens, for example between 10 ohms and 10 megohms. Moreover, the electron beam has associated therewith a high cost of implementation.

SUMMARY OF THE INVENTION

To test the integrity of an electrical interconnection board having at least two circuit networks (nets) both in terms of its continuity and whether shorted to one of the other nets, each net having a plurality of nodes with conductive paths interconnecting the nodes within any one of said circuit networks, each of the circuit networks having a nominal resistance between any of its nodes, the present invention uses a method for testing the electrical interconnection board for open and short conditions. The method includes selectively contacting the circuit networks by a single probe in a sequence and providing a path to apply a charge to the circuit networks via the single probe. The method also includes detecting the level of charge at each of the circuit networks as a function of the position of the single probe in the sequence. Upon detecting the level of charge, the method includes comparing the detected level of charge at the circuit network with a level of charge at an uncharged network as indicators of short conditions. Moreover, the method includes selectively contacting the circuit networks by a pair of probes in the sequence and providing a path to measure resistance of the circuit network; and measuring the resistance of the circuit networks in the sequence as an indicators of potential open conditions. Lastly, the method includes comparing the measured resistance of the circuit networks indicating potential open conditions with the nominal resistance of a circuit network having no open circuit fault in order to verify the potential open condition.

In accordance with another aspect of the present invention, there is provided an apparatus for testing printed circuit electrical parts containing a reference conductive plane and a plurality of circuit networks, which on non-faulty parts are supposed to be electrically isolated from each other. The apparatus includes a first and second probe, each independently movable into contact with circuit elements of said electrical part. A voltage source is coupled to the first probe and is for sequentially applying electrical charges to circuit networks on an electrical part, in conjunction with a series of contacting movements of the first probe. A first testing circuit is coupled to the first probe and is for sequentially detecting electrical charges held on the circuit networks as potential indicators of short conditions. A second testing circuit is coupled to the first and second probes and is for selectively performing continuity tests on networks contacted by the first and second probes in order to establish the presence or absence of a potential open condition in said networks contacted by the first and second probes. In addition, a switching arrangement, coupled to the first and second probes, is included for selecting either the voltage source, the first testing circuit, or the second testing circuit.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may be best understood by reference to the following description taken in conjunction with the accompanying drawing figures wherein:

FIG. 3 is a schematic of the present invention system illustrating resistive detection and charge detection.

DESCRIPTION Of THE ILLUSTRATIVE EMBODIMENT(S)

Figure 1:
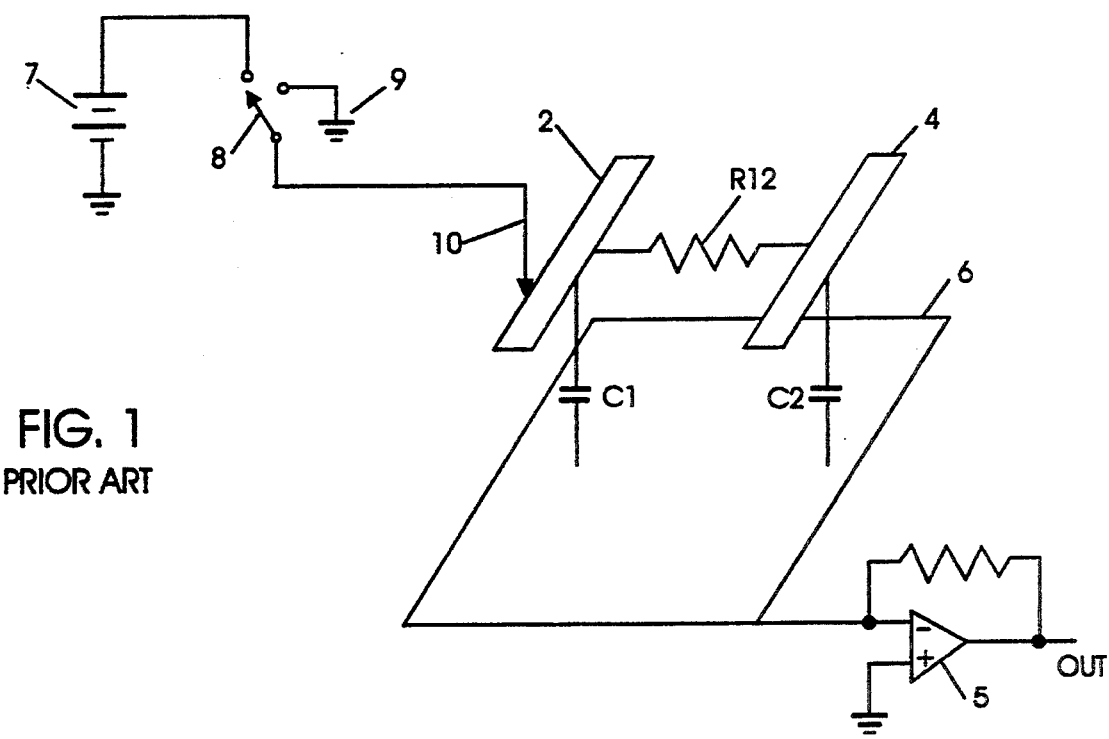
FIG. 1 is a simplified illustration of a prior art system for measuring shorts between nets on a circuit board.

With reference to FIG. 1, a prior art system and method of detecting shorts of a being tested network, or "net", 2 to any other net of a circuit board is shown. A net may have two or more connection points herein referred to as nodes. A net is likewise the sum of all combinations of electrical paths between nodes. A sub path will be referred to as a segment. The prior art system and method is more fully described in U.S. Pat. No. 5,138,266 and is hereby incorporated by reference. As illustrated, the circuit board has a reference plane, or power plane, 6. For the single probe system of FIG. 1, reference plane 6 can be external or internal, as in a substrate that has multiple layers each of which may contain multiple nets. Each of the nets, as for example net 2, has a certain area which depends on the width and the length thereof. Accordingly, between net 2 and reference plane 6 there is a corresponding capacitance $C_1$. Between net 2 and net 4 there is a resistance $R_{12}$. Further, there is a capacitance $C_2$ between net 4 and reference plane 6. The negative input of an op amp 5 is connected to the reference plane 6; and the positive input of op amp 5 being connected to ground. The output of the op amp 5 is coupled back to its negative input through a resistor as negative feedback. The prior art apparatus and method locates a switching arrangement 8 connected to a probe 10, so that the probe 10 can be selectively connected to either a ground terminal 9 for discharging the being tested net 2 to which the probe 10 is applied, or to a voltage supply 8 for charging the net. When the being tested net 2 is charged from the voltage supply 7 via the probe 10, the voltage on the output of op amp 5 exhibits a negative going spike, and the net 2 will stay charged for a considerable time.

As subsequent nets are contacted, by the probe 10, with the switch 8 making contact to the voltage supply 7, a negative going spike on the output of op amp 5 will result. A subsequent net 4 which is shorted, for example through $R_{12}$, to net 3 which has been charged by the voltage source will itself be charged. Accordingly, if there is a short between a previously charged net and some other subsequently tested net, the subsequently tested net being contacted by the probe with the switch 8 making contact to the voltage supply 7, an absence of a spike at the output of op amp 5 will indicate a fault.

Figure 2:
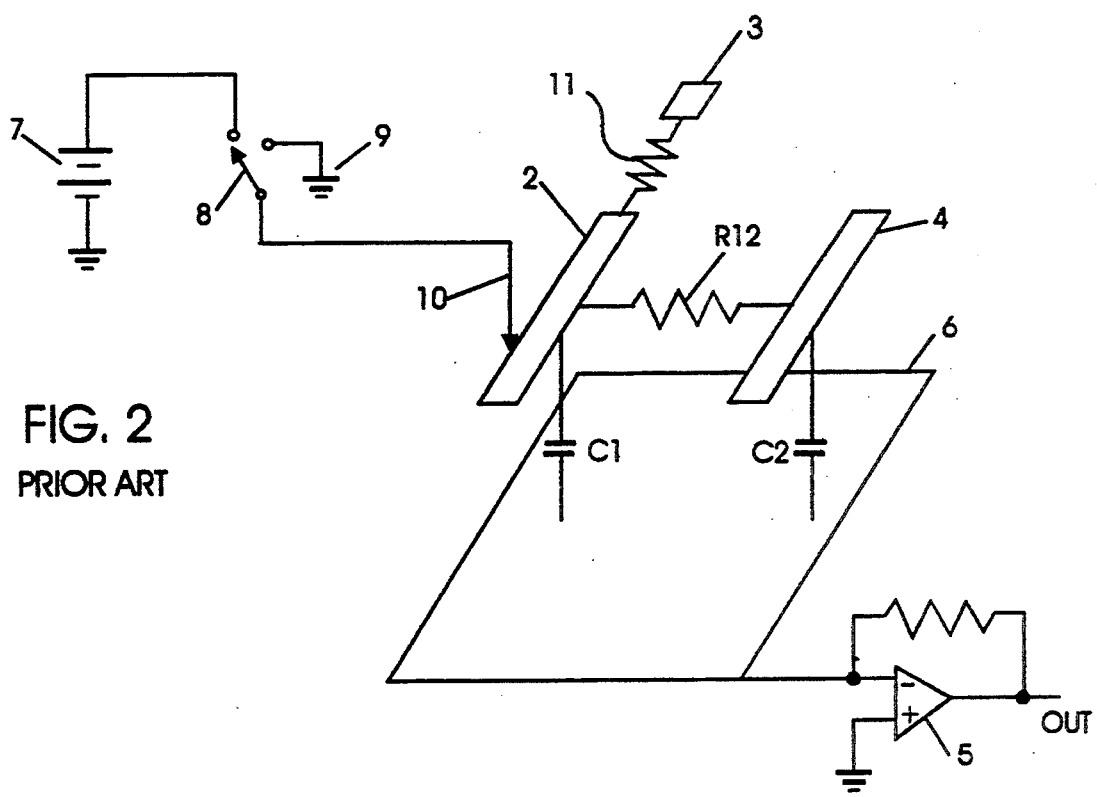
FIG. 2 is a simplified schematic of the FIG. 1 prior art system in which the being tested net has a discontinuity.

With reference next to FIG. 2, the same prior art system and method of FIG. 1 is shown for detecting opens of a being tested net 2. As in FIG. 1, each of the nets has a certain area which depends on the width and length thereof. Accordingly, if there is discontinuity at the being tested net 2, for example, due to a break such as 11, the capacitance $C_1$ will be lower than an otherwise non-faulty net. The break 11 has a resistance $R_{11}$ associated therewith, representing an open condition. As in the description of the apparatus and method of FIG. 1, when the being tested net 2 is charged from the voltage supply 7 via the probe 10, the voltage output of op amp 5 exhibits a negative going spike, and the net 2 will stay charged for a considerable time. As the voltage supply 7 is applied to other n, odes within the being tested net 2, no voltage spike at the output of op amp 5 is expected. If there is an open within a previously charged net, as the voltage supply 7 is applied to another node, for example at reference number 3, within the being tested net 2, a negative spike at the, output of op amp 5 indicates an open condition within the being tested net 2.

Still referring to FIG. 2, a break 11 with a resistance $R_{11}$ having a value greater than the nominal resistance required to satisfy a "no opens" test, yet in the order of megohms, may not be of sufficient magnitude to prevent the charging of segment 3. That is, although the value of the resistance $R_{11}$ is greater than an acceptable nominal resistance, the nature of the break 11 may be such that a charge deposited on the being tested net 2 will nevertheless cause the segment 3 to be charged A break 11 with a resistance $R_{11}$ having a value of 10 megohms or greater may, however, be of sufficient magnitude to prevent the charging of segment 3 and thereby providing an accurate opens test. Thus, for a break 11 with a resistance $R_{11}$ having a value greater than a desired nominal resistance, yet less than 10 megohms, a false "no opens" indication may result. Therefore, using charge detection alone may not necessarily ensure that the net has, in fact, no opens.

Referring now to the drawing, and particularly FIG. 3 thereof, a block diagram of an apparatus for detecting opens and shorts in a circuit board is shown. According to the illustrative embodiment of the present invention, a device under test (DUT), which in this case is a circuit board 14, is positioned on a reference plane 20. As in the description of FIG. 1, the network 16, or isolated conductive path being checked, on the circuit board 14 has a certain area which depends on the width and the length thereof. Probes 22, 24 are moveable in the X, Y, and Z directions as part of a two-point robotic handler (not shown), so the probes may be brought into contact selectively with nodes on any given net in a predetermined sequence. A switching arrangement 34 is connected to each of the probes 22, 24 so that at least one probe can be selectively connected to either a voltage source 32, resistance measuring device 35, or charge detecting device 36 and any given net to which the probe is applied. Reference plane 20 and charge, detecting device 36 are each connected to ground, or otherwise connected to a common reference. When activated, the voltage source charges the being tested net 16, the resistive measuring device 35 measures the resistance between probes 22 and 24 and the charge detecting device 36, detects the presence or absence of charge, above or below a predetermined level, between the selected probe(s) and the reference 20.

Operation of the apparatus is controlled by a system controller 37. The system controller 37 provides coordinate positioning data to the robotic handler (not shown), which in turn positions probes 22, 24 to desired locations in the predetermined sequence. A being tested net is selectively contacted by a single probe during charging or charge detection; by two probes during resistance measurement. When referring to a "being tested net", it is to be understood that reference is made to a particular network associated with one or both probes 22, 24 in the predetermined sequence. Alternatively, both probes may be programmed to detect charge, and deposit charge, thereby decreasing the test time for a device under test. Moreover, the system controller may control the switching arrangement 34, in order to selectively provide a path between the power supply 32, resistance, measuring device 35, or charge detecting device 36 and the probes 22, 24.

In testing for shorts between nets, such as between net 16 and any other net, the system controller 37 begins by activating the charge detecting device 36 through the switching arrangement 34 and by selectively contacting the first net in the predetermined sequence with a probe. The charge detecting device 36 detects the level of charge present at the being tested net. A net which has not been intentionally charged ideally has no charge associated therewith. However, capacitive coupling between otherwise isolated nets may exist, resulting in a low level of charge at an otherwise isolated net. Thus, the level of charge at a being tested net is compared to a predetermined level of charge, so that charge due to capacitive coupling is ignored and charge due to resistive coupling is not. If charge below the predetermined level is detected, it is assumed that the being tested net is isolated from any prior nets which had been charged. Otherwise, upon detecting the presence of charge above the predetermined level at a being tested net, which has not been intentionally charged, it is assumed that the being tested net is shorted to a previously charged net.

Upon establishing whether or not the being tested net is isolated from all nets which had been previously charged, the being tested net itself is charged by selecting the voltage source 32 through the switching arrangement 34. It is to be understood that, for the first net being tested in the predetermined sequence, it may be unnecessary to check for charge prior to applying the voltage source 32 through the switching arrangement 34. The invention takes advantage of the ability of a net to accept charge from a voltage source. That is, upon applying a voltage to a being tested net, and subsequently removing the applied voltage from the net, charge remains at the net. The potential, or stored charge, provides the means for determining the defect level of the net. Having charged the net 16, any of the remaining nets may be tested by first connecting to the charge detecting device 36, through the switching arrangement 34, to the selected one of either probe 22 or 24. Selected nets, determined in the predetermined sequence, are contacted by the selected one of either probe 22 or 24. It is assumed that there is no short between a subsequently tested net and a previously charged net if no charge is detected at the subsequently tested net in the predetermined sequence. If there is a short between net 16 and some other net, say net 18, the charge applied to net 16 will cause net 18 to itself be charged. Accordingly, if a charge is detected at a subsequently tested net, a short is assumed to exist between a previously charged net and the being tested net.

Referring still to FIG. 3, a discontinuity at net 16 is represented by a break 17. The nature of the break 17 may not lead to an accurate "no opens" reading with the charge detection method, as discussed in the prior art embodiment of FIG. 2. In testing for opens in a net therefore, the system controller 37 begins by activating the resistance measuring device 35 through switching arrangement 34 and by selectively contacting selected nodes, determined in the predetermined sequence, by the probes 22 and 24. The resistance measuring device 35 measures the continuity between the selected nodes or segments as, for example, between net 16 and segment 15. The measured value of resistance is compared to a predetermined nominal resistance for a non-faulty net in order to verify the presence or absence of an open within the net.

It is contemplated that the function of the resistance measuring device 35 is not limited to checking for potential open conditions. Namely, it may be desirable to measure the resistance between nets in order to determine whether a short condition exists instead of using the charge detection method as previously described.

In accordance with the present invention, the predetermined sequence in the method of testing for potential opens or shorts using the charge detecting device 36 is implemented by programming the system controller 37 to control the probes 22, 24 to selectively contact the circuit 14 in the predetermined sequence. The interested reader is directed to U.S. Pat. No. 5,122,753 for a representative method of implementing such a sequence; and to any extent necessary or appropriate to gain a full understanding of this invention, is hereby incorporated by reference into the present description. Likewise, the coding of steps as described into instructions or a program suitable to control the system controller 37 will be understandable to one having ordinary skill in the art of programming. Because of the time involved in testing for a short between a charged net and each of the other nets in the device under test, an embodiment of the present invention contemplates testing for shorts only between likely candidate nets. Likely candidates for a shorts test are usually those nets which conform to a given adjacency criteria.

While the invention has been particularly shown and described with reference to one embodiment thereof, it will be understood by those skilled in the art that various changes in form and detail may be made without departing from the spirit and scope of the invention.

What is claimed is:

1. For an electrical interconnection board having at least two circuit networks, each having a plurality of nodes with conductive paths interconnecting the nodes within any one of said circuit networks, each of said circuit networks having a nominal resistance between any of said plurality of nodes associated with a given one of said networks, said nominal resistance representing the maximum resistance associated with a circuit network having no open circuit fault, a method for testing an electrical interconnection board for open and short conditions, said method comprising the steps of:

(a) selectively contacting one of said circuit networks by a single probe in a first sequence and applying a voltage charge to said one circuit network via said single probe;
 (b) detecting the level of voltage charge at another of said circuit networks as a function of the position of said single probe in said first sequence;
 (c) comparing said detected level of charge at said another circuit network with a level of charge at an uncharged network to determine if said another circuit network is shorted to a previously charged circuit network;
 (d) applying a voltage charge to said another circuit network via said single probe in said first sequence;
 (e) selectively contacting each of said circuit networks, separately and in a second sequence, by a pair of probes and providing a path to measure a resistance of each of said circuit networks;
 (f) measuring the assistance of each of said circuit networks in said second sequence; and
 (g) comparing said measured resistance of each of said circuit networks with said nominal resistance to determine whether any of said circuit networks have an open circuit fault.

2. The method of claim 1, wherein steps (b) through (d) are repeated for all circuit networks in said sequence before continuing with the step (e).

3. The method of claim 1, wherein steps (a) through (d) are accomplished with a plurality of probes, wherein only one of said plurality of probes is active at any given time during said sequence.

4. Apparatus for testing an electrical interconnection board containing a reference conductive plane and a plurality of circuit networks, said apparatus comprising:

first and second probes independently movable into contact with said plurality of circuit networks;
 voltage source, for selectively applying voltage charges to a plurality of said circuit networks on said electrical interconnection board, in conjunction with a series of contacting movements of said first probe;
 first testing circuit means, for sequentially detecting voltage charges held on each of said plurality of said circuit networks, contacted by said first probe, to determine if any of said plurality of circuit networks are shorted to a previously charged circuit network;
 second testing circuit means, for selectively performing continuity tests on networks contacted by said first and second probes, in order to establish the presence or absence of an open condition in said networks contacted by said first and second probes; and
 switching arrangement, coupled to said first and second probes, for selecting any one of said voltage source, said first testing circuit means, and said second testing circuit means.

5. The apparatus as in claim 4 further comprising:
 system controller for controlling the movement of said probes and activating said voltage source, said first testing circuit, said second testing circuit, and said switching arrangement.

6. The apparatus as in claim 4 wherein said first testing circuit means further comprises a contact element for making contact with said reference plane of said electrical interconnection board.

7. The apparatus as in claim 4 wherein said second testing circuit means, for selectively performing continuity tests, may determine whether a short condition exists between networks contacted by said first and second probes.

8. The apparatus as in claim 7, further comprising:
 control means for moving said first and second independently movable probes and for activating said first and second testing circuit means to obtain:
 (a) a measurement of the voltage charge present at each of said networks as a function of said independently movable probes in said sequence to determine if any of said plurality of circuit networks are shorted to a previously charged circuit network; and
 (b) a measurement of resistance for at least one of said circuit networks to determine whether said at least one circuit network has an open circuit fault.

* * * * *